(12) United States Patent
Ibi

(10) Patent No.: US 8,471,334 B2
(45) Date of Patent: Jun. 25, 2013

(54) LATERAL POWER MOSFET DEVICE HAVING A LINER LAYER FORMED ALONG THE CURRENT PATH TO REDUCE ELECTRIC RESISTANCE AND METHOD FOR MANUFACTURING THE SAME

(75) Inventor: Takao Ibi, Oita-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/230,325

(22) Filed: Sep. 12, 2011

(65) Prior Publication Data

US 2012/0061756 A1 Mar. 15, 2012

(30) Foreign Application Priority Data

Sep. 14, 2010 (JP) ................................ 2010-205495

(51) Int. Cl.
*H01L 29/66* (2006.01)
*H01L 21/8238* (2006.01)

(52) U.S. Cl.
USPC ............ 257/335; 257/339; 257/367; 438/200

(58) Field of Classification Search
USPC ............................. 257/335, 343; 438/29, 200
See application file for complete search history.

(56) References Cited

U.S. PATENT DOCUMENTS

| | | | |
|---|---|---|---|
| 5,932,897 A * | 8/1999 | Kawaguchi et al. .......... | 257/141 |
| 7,531,853 B2 | 5/2009 | Saito et al. | |
| 7,646,059 B2 | 1/2010 | Kawaguchi et al. | |
| 7,652,346 B2 | 1/2010 | Suzuki et al. | |
| 7,705,417 B2 | 4/2010 | Oishi | |
| 2002/0197782 A1 * | 12/2002 | Kitamura ....................... | 438/200 |
| 2007/0034894 A1 * | 2/2007 | Kawaguchi et al. .......... | 257/139 |
| 2009/0039422 A1 | 2/2009 | Kim | |
| 2009/0140343 A1 * | 6/2009 | Feilchenfeld et al. ........ | 257/367 |
| 2010/0207233 A1 * | 8/2010 | Gambino et al. .............. | 257/501 |
| 2011/0101453 A1 * | 5/2011 | Lin et al. ....................... | 257/339 |

FOREIGN PATENT DOCUMENTS

JP 2007-073942 3/2007

* cited by examiner

*Primary Examiner* — Long Tran
*Assistant Examiner* — Dzung Tran
(74) *Attorney, Agent, or Firm* — Patterson & Sheridan, LLP

(57) ABSTRACT

According to one embodiment, a semiconductor device includes a channel formation region of first conductivity type, a first offset region of second conductivity type, a first insulating region, a first liner layer, a first semiconductor region of second conductivity type, a second semiconductor region of second conductivity type, a gate insulating film, and a gate electrode. The first liner layer is provided between the first offset region and the first insulating region. The first semiconductor region of second conductivity type is provided on the side opposite to the channel formation region sandwiching the first insulating region therebetween and having impurity concentration higher than that of the first offset region. The second semiconductor region of second conductivity type is provided on the side opposite to the first semiconductor region sandwiching the channel formation region therebetween and having impurity concentration higher than that of the first offset region.

18 Claims, 4 Drawing Sheets

LATERAL POWER MOSFET DEVICE HAVING A LINER LAYER FORMED ALONG THE CURRENT PATH TO REDUCE ELECTRIC RESISTANCE AND METHOD FOR MANUFACTURING THE SAME

CROSS-REFERENCE TO RELATED APPLICATIONS

This application is based upon and claims the benefit of priority from the prior Japanese Patent Application No. 2010-205495, filed on Sep. 14, 2010; the entire contents of which are incorporated herein by reference.

FIELD

Embodiments described herein relate generally to a semiconductor device and a method for manufacturing the same.

BACKGROUND

In MOS field effect transistors (MOSFET), a structure in which an insulator is buried in an offset region (drift region) (STI; shallow trench isolation) is known.

When this type of MOSFET is operated, a carrier moves by going around below the buried insulator.

Thus, since a moving distance becomes longer by the portion going around below the insulator, there is a fear that electric resistance is raised.

DETAILED DESCRIPTION

Figure 1:
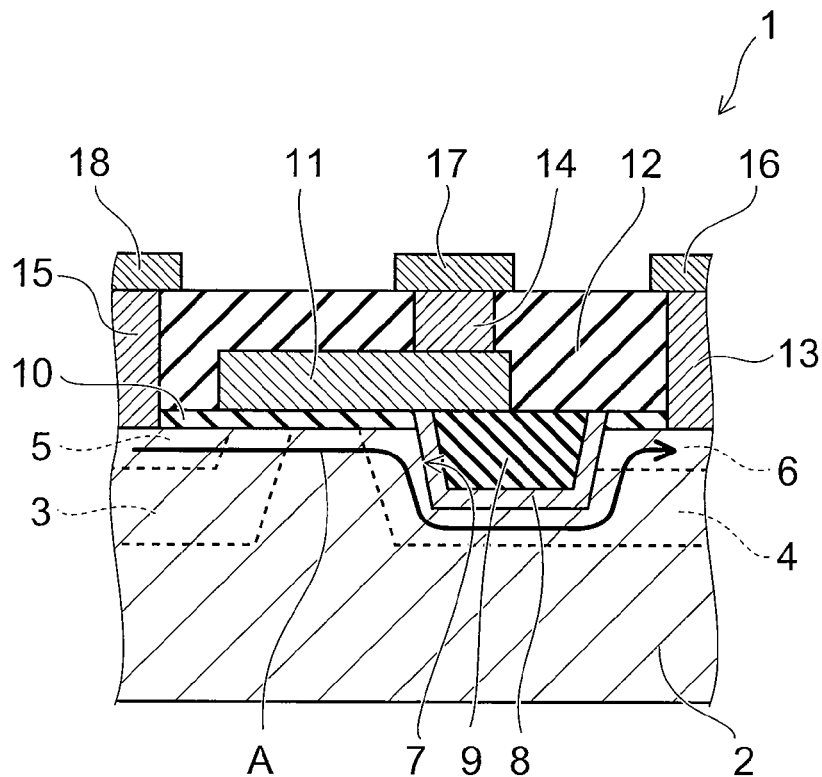
FIG. 1 is a cross-sectional view for illustrating a semiconductor device according to a first embodiment.

In general, according to one embodiment, a semiconductor device includes a channel formation region of first conductivity type, a first offset region of second conductivity type, a first insulating region, a first liner layer, a first semiconductor region of second conductivity type, a second semiconductor region of second conductivity type, a gate insulating film, and a gate electrode. The first insulating region is buried in the surface of the first offset region. The first liner layer is provided between the first offset region and the first insulating region. The first semiconductor region of second conductivity type is provided on the side opposite to the channel formation region sandwiching the first insulating region therebetween. The first semiconductor region of second conductivity type has impurity concentration higher than that of the first offset region. The second semiconductor region of second conductivity type is provided on the side opposite to the first semiconductor region sandwiching the channel formation region therebetween. The second semiconductor region of second conductivity type has impurity concentration higher than that of the first offset region. The gate insulating film is provided on the channel formation region and the first offset region. The gate electrode is provided on the gate insulating film.

In general, according to another embodiment, a method is disclosed for manufacturing a semiconductor device. The method can include forming a first trench in the surface of a substrate. The method can include forming a first liner layer inside the first trench. The method can include forming a first insulating region by burying an insulating material inside the first trench on which the first liner layer has been formed. The method can include forming an insulating film on the surface of the substrate. The method can include forming a channel formation region of first conductivity type inside the surface of the substrate which does not include a region where the first trench has been formed. The method can include forming a first offset region of second conductivity type inside the surface of the substrate which includes a region where the first trench has been formed. The method can include forming a first semiconductor region of second conductivity type having impurity concentration higher than that of the first offset region inside the surface of the substrate on the side opposite to the channel formation region sandwiching the first insulating region therebetween. The method can include forming a second semiconductor region of second conductivity type having impurity concentration higher than that of the first offset region inside the surface of the substrate on the side opposite to the first semiconductor region sandwiching the channel formation region therebetween along with the forming the first semiconductor region. The method can include forming a gate electrode through the insulating film formed on the surfaces of the channel formation region and the first offset region.

Various embodiments will be described hereinafter with reference to the accompanying drawings. In the drawings, like components are marked with the same reference numerals and a detailed description thereof is omitted as appropriate.

[First Embodiment]

FIG. 1 is a cross-sectional view for illustrating a semiconductor device according to a first embodiment.

FIG. 1 exemplifies an example in which a semiconductor device 1 is an LDMOSFET (Laterally Diffused MOSFET).

FIG. 1 illustrates a semiconductor device formed on a region divided by an element separation layer (DTI; Deep Trench Isolation) or PN-junction separation or the like, not shown.

As illustrated in FIG. 1, on the surface region of a p-type (first conductivity type) or an n-type (second conductivity type) silicon substrate 2 provided on the semiconductor device 1, a p⁻-type channel formation region 3 and a n⁻-type offset region 4 (first offset region) formed adjacent to the channel formation region 3 are formed. On the surface region of the p⁻-type channel formation region 3, an n⁺-type source region 5 (second semiconductor region) is formed. On the surface region of the n⁻type offset region 4, an n⁺-type drain region 6 (first semiconductor region) is formed.

The offset region 4 is isolated from the channel formation region 3, and a part of the silicon substrate 2 intervenes between the offset region 4 and the channel formation region 3.

The source region 5 has impurity concentration higher than that of the offset region 4. The drain region 6 has impurity concentration higher than that of the offset region 4.

That is, the n⁺-type source region 5 is formed on the side opposite to the drain region 6 sandwiching the channel formation region 3 between them and has impurity concentration higher than that of the offset region 4.

The n+-type drain region 6 is formed on the side opposite to the channel formation region 3 sandwiching an insulating region 9 between them and has impurity concentrations higher than that of the offset region 4.

In this specification, the "impurity concentration" refers to the concentration of the impurities contributing to conductivity of a semiconductor material and if the impurity which becomes a donor and the impurity which becomes an acceptor are both contained in the semiconductor material, it refers to the concentration of those excluding an offset of the donor and the acceptor in the activated impurities.

On the surface region of the offset region 4, a trench 7 (first trench) is formed, and the insulating region 9 (first insulating region) is buried in the trench 7 through a liner layer 8 (first liner layer). That is, the insulating region 9 is buried in the surface of the offset region 4. The semiconductor device 1 has a structure in which the insulating region 9 is buried in the surface region of the offset region 4 between the source region 5 and the drain region 6 (STI; Shallow Trench Isolation).

The trench 7 is formed in the surface region of the offset region 4 between the drain region 6 and the source region 5. One of the side faces of the trench 7 is in contact with the drain region 6. The upper face of the trench 7 is opened in the upper face of the gate insulating film 10. The lower face of the trench 7 is located below the lower face of the drain region 6 and above the lower face of the offset region 4.

The liner layer 8 is formed between the offset region 4 and the insulating region 9. The liner layer 8 which is a single layer is exemplified but the liner layer may be formed of a plurality of layers.

A part of the upper face of the insulating region 9 is in contact with a part of the lower face of a gate electrode 11. The insulating region 9 may be formed of an insulating material such as silicon oxide, for example.

On the surface of the silicon substrate 2, a gate insulating film 10 is formed. That is, the gate insulating film 10 is formed on the channel formation region 3 and the offset region 4. On the gate insulating film 10, the gate electrode 11 formed of polysilicon into which impurities are introduced is formed, for example. The gate electrode 11 is provided on a region immediately above the region between the drain region 6 and the source region 5.

On the gate insulating film 10, the gate electrode 11 and the like, an insulating film 12 made of silicon oxide, for example, is provided. On the insulating film 12, contacts 13 to 15 which penetrate the insulating film 12 are provided. On the surface of the insulating film 12, wires 16 to 18 are provided. The lower end of the contact 13 is connected to the drain region 6, while the upper end is connected to the wire 16. The lower end of the contact 14 is connected to the gate electrode 11, while the upper end is connected to the wire 17. The lower end of the contact 15 is connected to the source region 5, while the upper end is connected to the wire 18.

Subsequently, the structure in which the insulating region 9 is buried in the surface region of the offset region 4 (STI; Shallow Trench Isolation) will be further exemplified.

As described above, the semiconductor device 1 is formed on a region divided by an element separation layer (DTI; Deep Trench Isolation), PN-junction separation or the like, not shown.

That is, the insulating region 9 buried in the surface region of the offset region 4 is different from the element separation layer that separates the semiconductor devices 1 from each other. That is, the insulating region 9 is formed in order to protect a gate portion if a high voltage is applied. Thus, by forming the insulating region 9, a breakdown voltage between the source region 5 and the drain region 6 can be raised.

When the semiconductor device 1 is to be operated, a carrier moves by going around below the insulating region 9 buried in the trench 7 as indicated by an arrow A in FIG. 1. Thus, since a moving distance becomes longer by a portion going around below the insulating region 9, there is a fear that electric resistance is raised. Thus, in the embodiment, the liner layer 8 is formed along the moving path (current path) of the carrier so as to reduce the electric resistance.

In this case, if a moving degree of the carrier can be increased, the electric resistance can be reduced. In order to increase the moving degree of the carrier, it is only necessary that tensile stress is generated in silicon. That is, it is only necessary to generate tensile stress in a portion (interface portion) where the liner layer 8 is in contact with the offset region 4 or the drain region 6 by forming the liner layer 8 in which compression stress is generated.

For example, it is only necessary to form the liner layer 8 made of a material having a lattice constant different from the lattice constant of silicon. As such liner layer 8, those formed of at least any of silicon nitride and silicon oxide nitride, for example, can be exemplified.

Also, if the tensile stress generated in the offset region 4 or the drain region 6 is too large, there is a fear that a split or a crack might occur in the offset region 4 or the drain region 6. Thus, the thickness of the liner layer 8 is preferably made appropriate so that the excessive tensile stress does not occur.

In this case, by setting the thickness of the liner layer 8 to approximately 10 to 20 nm, electric resistance can be reduced and also, occurrence of excessive tensile stress in the offset region 4 or the drain region 6 can be suppressed.

Also, as described above, the breakdown voltage can be raised by forming the insulating region 9, but the breakdown voltage can be further raised by forming the liner layer 8.

For example, assuming that the insulating region 9 is formed of silicon oxide and the liner layer 8 is formed of silicon nitride having dielectric constant higher than that of silicon oxide, electric fields generated in the offset region 4 or the drain region 6 can be affected. Thus, the breakdown voltage can be further raised.

Also, the liner layer 8 may be formed partially on the side face or the lower face of the trench 7. However, as illustrated in FIG. 1, the liner layer 8 is preferably formed continuously on the side face or the lower face of the trench 7.

According to the embodiment, since the liner layer 8 is formed along the moving path (current path) of the carrier, electric resistance can be reduced. Also, the breakdown voltage can be improved. Thus, improvement of energy efficiency, reduction of a silicon area, reduction of a manufacturing cost and the like can be realized.

[Second Embodiment]

The exemplification in FIG. 1 is formation of the liner layer of an insulating material, but the liner layer may be formed of a conductive material.

In this case, a liner layer 8a (first liner layer) formed of a conductive material having a lattice constant different from the lattice constant of silicon may be formed. For example, the liner layer 8a may be formed of a conductive material or the like whose lattice constant is adjusted by solid solution of another semiconductor substance in silicon. Such conductive materials include silicon germanium, for example. The liner layer 8a which is a single layer is exemplified but the liner layer may be formed of a plurality of layers.

By forming the liner layer 8a such that compression stress is generated, tensile stress can be generated in a portion (interface portion) where the liner layer 8a is in contact with the offset region 4 or the drain region 6.

Since reduction of electric resistance by forming the liner layer 8a such that compression stress is generated or ensuring of appropriate thickness of the liner layer 8a and the like are similar to the above-described liner layer 8, the explanation will be omitted.

In this case, since the liner layer 8a is formed of a conductive material, short-circuit of the gate electrode 11 and the offset region 4 and the like needs to be prevented.

Figure 2:
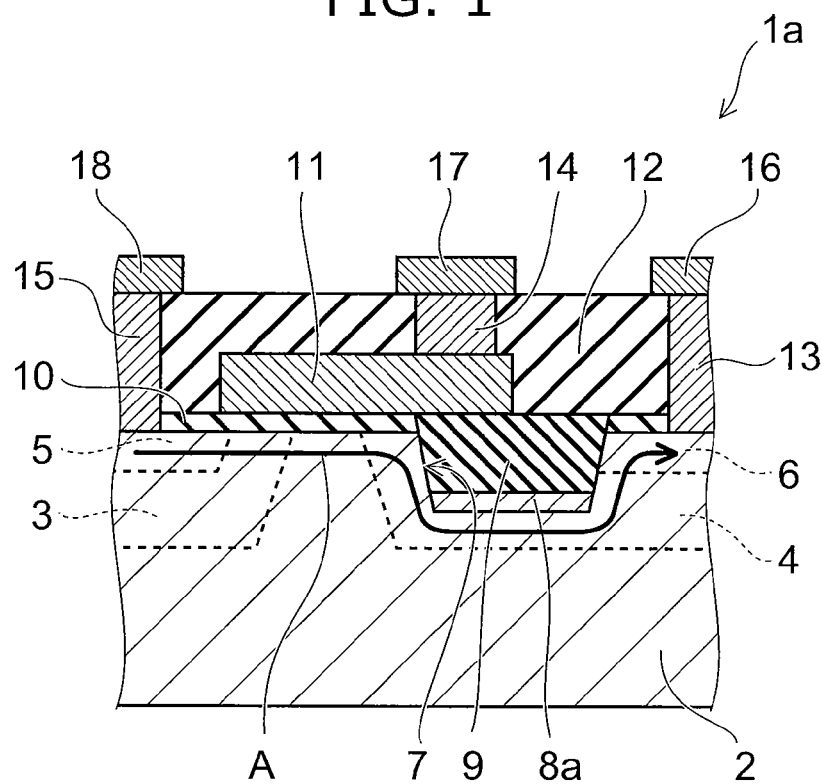
FIG. 2 is a cross-sectional view for illustrating a semiconductor device according to a second embodiment.

FIG. 2 is a cross-sectional view for illustrating a semiconductor device according to a second embodiment.

FIG. 2 illustrates a semiconductor device formed on a region divided by the element separation layer (DTI; Deep Trench Isolation), PN-junction separation or the like, not shown.

As illustrated in FIG. 2, the insulating region 9 and the liner layer 8a are formed on a semiconductor device 1a. In the embodiment, the liner layer 8a is formed of a conductive material such as silicon germanium.

Also, in order to prevent short-circuit of the gate electrode 11 and the offset region 4 and the like, the liner layer 8a is formed on the lower face of the trench 7. The liner layer 8a may be formed on the side face of the trench 7 to such a degree that short-circuit does not occur.

According to the embodiment, since the liner layer 8a is formed along the moving path (current path) of the carrier, electric resistance can be reduced. Thus, improvement of energy efficiency, reduction of a silicon area, reduction of a manufacturing cost and the like can be realized.

[Third Embodiment]

Figure 3:
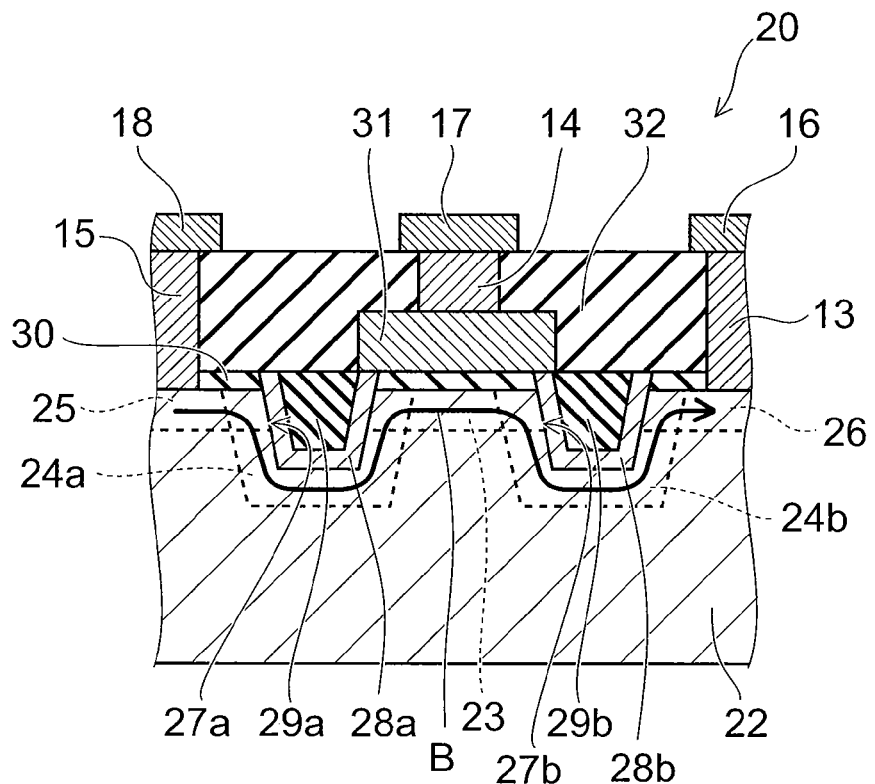
FIG. 3 is a cross-sectional view for illustrating a semiconductor device according to a third embodiment.

FIG. 3 is a cross-sectional view for illustrating a semiconductor device according to a third embodiment.

FIG. 3 exemplifies a case in which a semiconductor device 20 is power MOSFET as an example.

FIG. 3 illustrates a semiconductor device formed on a region divided by the element separation layer (DTI; Deep Trench Isolation), PN-junction separation or the like, not shown.

As illustrated in FIG. 3, on the surface region of a p-type or n-type silicon substrate 22 provided on the semiconductor device 20, an n$^-$-type offset region 24a (second offset region) and an n$^-$-type offset region 24b (first offset region) formed adjacent to the offset region 24a are formed.

That is, the n$^-$-type offset region 24a is provided between a channel formation region 23 and a source region 25 and has impurity concentration lower than that of the source region 25.

Also, an n$^+$-type source region 25 (second semiconductor region) having impurity concentrations higher than that of the offset region 24b is formed with at least a part thereof formed on the surface region of the offset region 24a.

Also, an n$^+$-type drain region 26 (first semiconductor region) having impurity concentrations higher than that of the offset region 24b is formed with at least a part thereof formed on the surface region of the offset region 24b.

Also, the p$^-$-type channel formation region 23 is formed between the source region 25 and the drain region 26.

That is, the n$^+$-type source region 25 is formed on the side opposite to the drain region 26 sandwiching the channel formation region 23 and an insulating region 29a between them and has impurity concentration higher than that of the offset region 24b.

The n$^+$-type drain region 26 is formed on the side opposite to the channel formation region 23 sandwiching an insulating region 29b between them and has impurity concentration higher than that of the offset region 24b.

A trench 27a (second trench) is formed in the offset region 24a, and the insulating region 29a (second insulating region) is buried in the trench 27a through a liner layer 28a (second liner layer).

A trench 27b (first trench) is formed in the offset region 24b, and the insulating region 29b (first insulating region) is buried in the trench 27b through a liner layer 28b (first liner layer).

That is, the insulating region 29a is buried in the surface of the offset region 24a. The insulating region 29b is buried in the surface of the offset region 24b.

That is, the semiconductor device 20 has a structure in which the insulating region 29a is buried in the surface region of the offset region 24a and the insulating region 29b is buried in the surface region of the offset region 24b (STI; shallow trench isolation).

The trench 27a is formed in the surface region of the offset region 24a. One of the side faces of the trench 27a is in contact with the source region 25, while the other side face is in contact with the channel formation region 23. The upper face of the trench 27a is opened in the upper face of a gate insulating film 30. The lower face of the trench 27a is located below the lower face of the source region 25 and located above the lower face of the offset region 24a.

The trench 27b is formed in the surface region of the offset region 24b. One of the side faces of the trench 27b is in contact with the drain region 26, while the other side face is in contact with the channel formation region 23. The upper face of the trench 27b is opened in the upper face of the gate insulating film 30. The lower face of the trench 27b is located below the lower face of the drain region 26 and located above the lower face of the offset region 24b.

In this case, the trench 27a and the trench 27b may be formed so that they are symmetric with respect to a gate electrode 31.

The liner layer 28a is formed between the offset region 24a and the insulating region 29a. The liner layer 28b is formed between the offset region 24b and the insulating region 29b. The liner layers 28a and 28b which are single layers are exemplified but each of them may be formed of a plurality of layers.

The liner layers 28a and 28b are formed of a material having a lattice constant different from the lattice constant of silicon.

At least either of the liner layer 28a and the liner layer 28b may be formed of a material having a lattice constant different from the lattice constant of silicon. In this case, both the liner layers 28a and 28b are preferably formed of a material having the lattice constant different from the lattice constant of silicon.

The liner layers 28a and 28b are formed of at least either of silicon nitride and silicon oxide nitride.

The insulating regions 29a and 29b may be formed of an insulating material such as silicon oxide, for example.

On the surface of the silicon substrate 22, the gate insulating film 30 is formed. That is, the gate insulating film 30 is formed on the channel formation region 23 and on the offset regions 24a and 24b. On the gate insulating film 30, the gate electrode 31, for example, formed of polysilicon into which impurities are introduced is formed. The gate electrode 31 is provided on a region immediately above the channel formation region 23.

On the gate insulating film 30 and the gate electrode 31, an insulating film 32 made of silicon oxide, for example, is formed. On the insulating film 32, the contacts 13 to 15 which penetrate the insulating film 32 are provided. On the surface of the insulating film 32, the wires 16 to 18 are provided. The lower end of the contact 13 is connected to the drain region 26, while the upper end is connected to the wire 16. The lower end of the contact 14 is connected to the gate electrode 31, while the upper end is connected to the wire 17. The lower end of the contact 15 is connected to the source region 25, while the upper end is connected to the wire 18.

Subsequently, the structure in which the insulating regions 29a and 29b are buried in the surface region of the offset regions 24a and 24b (STI; Shallow Trench Isolation) will be further exemplified.

As described above, the semiconductor device 20 is formed on a region divided by the element separation layer (DTI; Deep Trench Isolation), PN-junction separation or the like, not shown.

That is, the insulating regions 29a and 29b formed on the surface regions of the offset regions 24a and 24b are different from the element separation layer that separates the semiconductor devices 20 from each other. That is, the insulating regions 29a and 29b are formed in order to protect a gate portion if a high voltage is applied. Thus, by forming the insulating regions 29a and 29b, a breakdown voltage between the source region 25 and the drain region 26 can be raised.

Here, when the semiconductor device 20 is operated, a carrier moves by going around below the insulating region 29a buried in the trench 27a and the insulating region 29b buried in the trench 27b as indicated by an arrow B in FIG. 3. Thus, since a moving distance becomes longer by a portion going around below the insulating regions 29a and 29b, there is a fear that electric resistance is raised. Thus, in the embodiment, the liner layers 28a and 28b are formed along the moving path (current path) of the carrier so as to reduce the electric resistance. That is, by forming the liner layers 28a and 28b similar to the above-described liner layer 8, electric resistance is reduced. Since the liner layers 28a and 28b can be made similar to the liner layer 8, the detailed description of them will be omitted.

According to the embodiment, since the liner layers 28a and 28b are formed along the moving path (current path) of the carrier, electric resistance can be reduced. Also, the breakdown voltage can be improved. Thus, improvement of energy efficiency, reduction of a silicon area, reduction of a manufacturing cost and the like can be realized.

[Fourth Embodiment]

The exemplification in FIG. 3 is the case in which the liner layer is formed of an insulating material, but the liner layer may also be formed of a conductive material.

Figure 4:
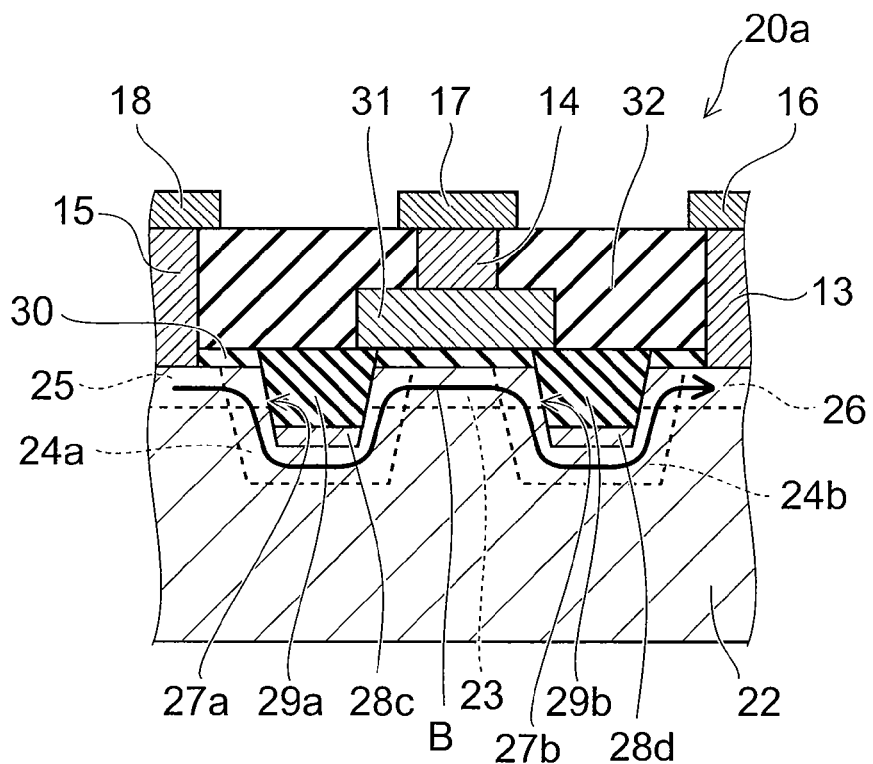
FIG. 4 is a cross-sectional view for illustrating a semiconductor device according to a fourth embodiment.

FIG. 4 is a cross-sectional view for illustrating a semiconductor device according to a fourth embodiment.

FIG. 4 illustrates a semiconductor device formed on a region divided by the element separation layer (DTI; Deep Trench Isolation), PN-junction separation or the like, not shown.

As illustrated in FIG. 4, the insulating regions 29a and 29b, a liner layer 28c (second liner layer), and a liner layer 28d (first liner layer) are formed on a semiconductor device 20a.

In the embodiment, the liner layers 28c and 28d formed of a conductive material having a lattice constant different from the lattice constant of silicon may be formed. For example, the liner layers 28c and 28d may be formed of a conductive material whose lattice constant is adjusted by solid solution of another semiconductor substance in silicon. Such conductive materials include silicon germanium, for example. The liner layers 28c and 28d which are single layers are exemplified but the liner layer may be formed of a plurality of layers.

Also, at least either of the liner layer 28c and the liner layer 28d may be formed of a conductive material having a lattice constant different form the lattice constant of silicon. In this case, it is preferable that both the liner layers 28c and 28d are formed of a conductive material having the lattice constant different from the lattice constant of silicon.

Since the liner layers 28c and 28d can be made similar to the above-described liner layer 8a, detailed description will be omitted.

Also, in order to prevent short-circuit of the gate electrode 11 and the offset regions 24a, 24b and the like, the liner layers 28c and 28d are formed on the lower face of the trenches 27a and 27b. The liner layers 28c and 28de may be formed on the side faces of the trenches 27a and 27b to such a degree that short-circuit does not occur.

According to the embodiment, since the liner layers 28c and 28d are formed along the moving path (current path) of the carrier, the electric resistance can be reduced. Thus, improvement of energy efficiency, reduction of a silicon area, reduction of a manufacturing cost and the like can be realized.

Subsequently, a manufacturing method of the semiconductor device according to the embodiment will be exemplified.

[Fifth Embodiment]

FIGS. 5A to 5I are process cross-sectional views illustrating a method for manufacturing the semiconductor device according to the fifth embodiment. Also, FIGS. 5A to 5I exemplify an example in which the semiconductor device 1 to be manufactured is an LDMOSFET (Laterally Diffused MOSFET).

FIGS. 5A to 5I illustrate a state in which a semiconductor device is formed on a region divided by the element separation layer (DTI; Deep Trench Isolation), PN-junction separation or the like, not shown.

Figure 5A:
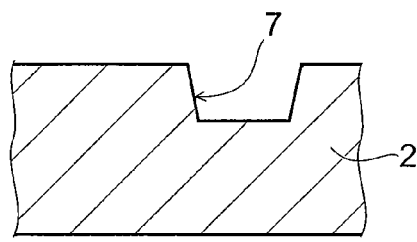
FIGS. 5A to 5I are process cross-sectional views illustrating a method for manufacturing the semiconductor device according to the fifth embodiment.

First, as illustrated in FIG. 5A, the trench 7 is formed in a region where the offset region 4 of the p-type or n-type silicon substrate 2 is to be formed. That is, the trench 7 is formed on the surface region of the silicon substrate 2. In this case, the trench 7 can be formed by etching the silicon substrate 2 by using an RIE (Reactive Ion Etching) method or the like. Subsequently, as illustrated in FIG. 5B, the liner layer 8 is formed inside the trench 7. That is, a film 58 which becomes the liner layer 8 is formed on the surface of the silicon substrate 2 and inside the trench 7. The formation of the film 58 can be made by using a CVD (Chemical Vapor Deposition) method or the like.

The film 58 may be a film formed of a material having a lattice constant different from the lattice constant of silicon. For example, the film may be formed at least either of silicon nitride and silicon oxide nitride.

Also, as described above, the film may be formed of a conductive material such as silicon germanium. However, if the film is formed of a conductive material, the film is to be formed at a predetermined location such as on the lower face of the trench 7 as described above. The example in which the film to be formed is a single layer is exemplified, but the film may be formed of a plurality of layers.

Figure 5F:
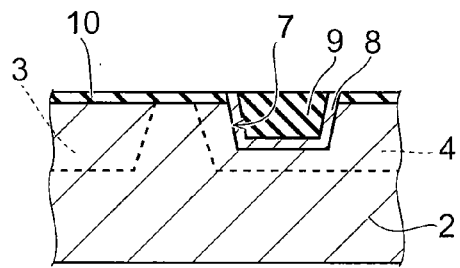
Figure 5B:
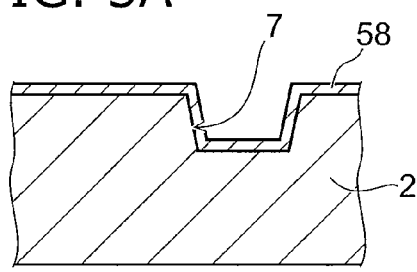
Figure 5G:
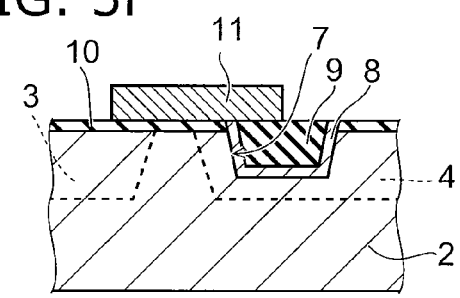
Figure 5C:
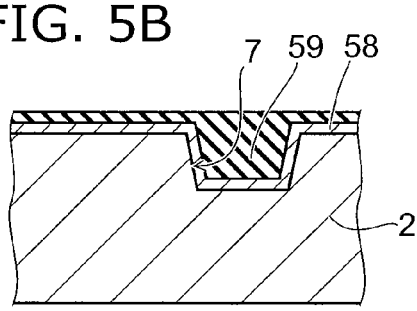

Subsequently, as illustrated in FIG. 5C, a film 59 which becomes the insulating region 9 is formed. At this time, the inside of the trench 7 is filled with the film 59 to be formed. That is, the insulating region 9 is formed by burying the insulating material inside the trench 7 on which the film 58 which becomes the liner layer 8 has been formed.

The formation of the film 59 can be made by using the CVD (Chemical Vapor Deposition) method, for example.

The film 59 may be formed of an insulating material such as silicon oxide, for example.

Figure 5H:
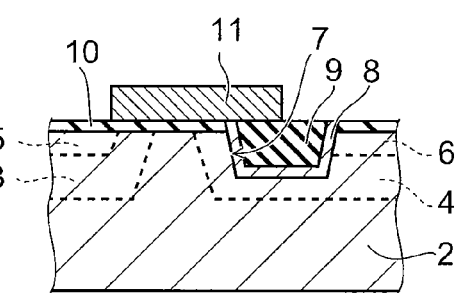
Figure 5D:
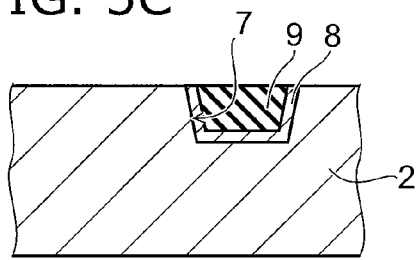

Subsequently, as illustrated in FIG. 5D, flattening is performed until the surface of the silicon substrate 2 is exposed. The flattening may be performed by using a CMP (Chemical Mechanical Polishing) method, for example.

By performing such flattening, the liner layer 8 is formed inside the trench 7, and the insulating material (the insulating region 9) is buried inside the trench 7.

Figure 5E:
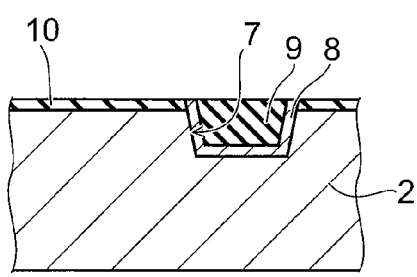

Subsequently, as illustrated in FIG. 5E, the gate insulating film 10 is formed on the surface of the silicon substrate 2. That is, the surface of the silicon substrate 2 is oxidized, and the gate insulating film 10 is formed. The formation of the gate insulating film 10 can be made by using a thermal oxidation method, for example.

Subsequently, as illustrated in FIG. 5F, the channel formation region 3 and the offset region 4 are formed. That is, the p-type channel formation region 3 is formed inside the surface of the silicon substrate 2 which does not include the region where the trench 7 has been formed. Also, the n-type offset region 4 is formed inside the surface of the silicon substrate 2 which includes the region where the trench 7 has been formed.

For example, the channel formation region 3 and the offset region 4 can be formed by implanting a boron ion into the region where the channel formation region 3 is to be formed, by implanting a phosphorous ion into the region where the offset region 4 is to be formed, and by applying heat treatment.

Subsequently, as illustrated in FIG. 5G, the gate electrode 11 is formed.

That is, the gate electrode 11 is formed through the gate insulating film 10 formed on the surface of the channel formation region 3 and the offset region 4.

The gate electrode 11 may be formed of polysilicon into which impurities are introduced, for example.

Subsequently, as illustrated in FIG. 5H, the source region 5 and the drain region 6 are formed.

That is, inside the surface of the silicon substrate 2 on the side opposite to the channel formation region 3 sandwiching the insulating region 9 between them, the n-type drain region 6 with impurity concentration higher than that of the offset region 4 is formed. Also, the drain region 6 is formed, and inside the surface of the silicon substrate 2 on the side opposite to the drain region 6 sandwiching the channel formation region 3 between them, the n-type source region 5 with impurity concentration higher than that of the offset region 4 is formed.

For example, the source region 5 and the drain region 6 can be formed by implanting an arsenic ion into the region where the source region 5 and the drain region 6 are to be formed and by applying heat treatment.

Figure 5I:
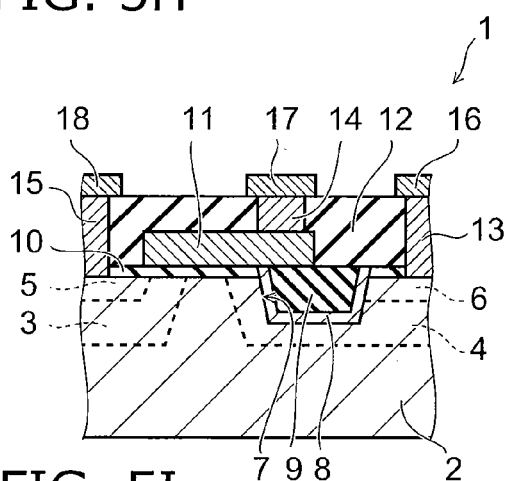

Subsequently, as illustrated in FIG. 5I, the insulating film 12, the contacts 13 to 15, and the wires 16 to 18 are sequentially formed.

The semiconductor device 1 can be manufactured as above.

A known technology can be applied to formation of the element separation layer, not shown, and the description will be omitted.

According to the embodiment, the liner layer can be formed along the moving path (current path) of the carrier. Thus, a semiconductor device that can reduce electric resistance and improve a breakdown voltage can be produced efficiently.

[Sixth Embodiment]

FIGS. 6A to 6I are process cross-sectional views illustrating a method for manufacturing the semiconductor device according to the sixth embodiment. Also, FIGS. 6A to 6I exemplify an example in which the semiconductor device 20 to be manufactured is a power MOSFET.

FIGS. 6A to 6I illustrate a state in which a semiconductor device is formed on a region divided by the element separation layer (DTI; Deep Trench Isolation), PN-junction separation or the like, not shown.

Figure 6A:
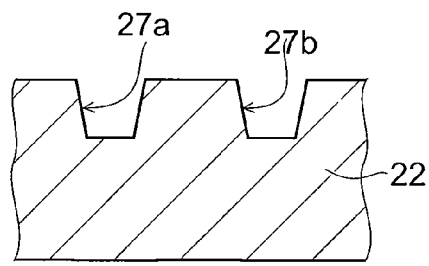
FIGS. 6A to 6I are process cross-sectional views illustrating a method for manufacturing the semiconductor device according to the sixth embodiment.

First, as illustrated in FIG. 6A, the trench 27a is formed in the surface region of the silicon substrate 22 and the trench 27b is formed in the surface region of the silicon substrate 22. That is, the trench 27a is formed in the region where the offset region 24a of the p-type or n-type silicon substrate 22 is formed. Also, the trench 27b is formed in the region where the offset region 24b adjacent to the offset region 24a is formed.

In this case, for example, the trenches 27a and 27b can be formed by etching the silicon substrate 22 by using the RIE (Reactive Ion Etching) method, for example.

Figure 6B:
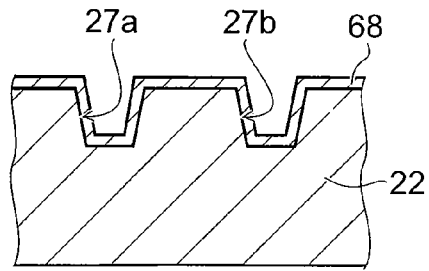

Subsequently, as illustrated in FIG. 6B, the liner layer 28a is formed inside the trench 27a, and the liner layer 28b is formed inside the trench 27b. That is, a film 68 which becomes the liner layers 28a and 28b is formed on the surface of the silicon substrate 22 and inside the trenches 27a and 27b. The formation of the film 68 can be made by using the CVD (Chemical Vapor Deposition) method, for example.

The film 68 may be a film formed of a material having a lattice constant different from the lattice constant of silicon. For example, the film may be formed at least either of silicon nitride and silicon oxide nitride.

In this case, at least either of the liner layer 28a and the liner layer 28b is formed of a material having the lattice constant different from the lattice constant of silicon. In this case, it is preferable that both the liner layers 28a and 28b are formed of a material having the lattice constant different from the lattice constant of silicon.

Also, as described above, the film may be formed of a conductive material such as silicon germanium.

However, if the film is formed of a conductive material, the film is to be formed at a predetermined location such as on the lower faces of the trenches 27a and 27b as described above.

In this case, at least either of the liner layer 28c and the liner layer 28d exemplified in FIG. 4 may be formed of a conductive material having the lattice constant different from the lattice constant of silicon. In this case, it is preferable that both the liner layers 28c and 28d are formed of a conductive material having the lattice constant different from the lattice constant of silicon.

The example in which the film to be formed is a single layer is exemplified, but the film may also be formed of a plurality of layers.

Figure 6C:
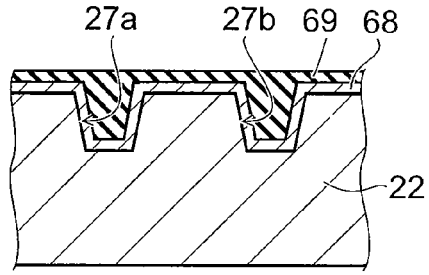

Subsequently, as illustrated in FIG. 6C, a film 69 which becomes the insulating regions 29a and 29b is formed. At this time, the insides of the trenches 27a and 27b are filled with the film 69 to be formed.

That is, the insulating regions 29a and 29b are formed by burying the insulating material inside the trenches 27a and 27b on which the film 68 which becomes the liner layers 28a and 28b has been formed.

The formation of the film 69 can be made by using the CVD (Chemical Vapor Deposition) method, for example.

The film 69 may be formed of an insulating material such as silicon oxide, for example.

Figure 6D:
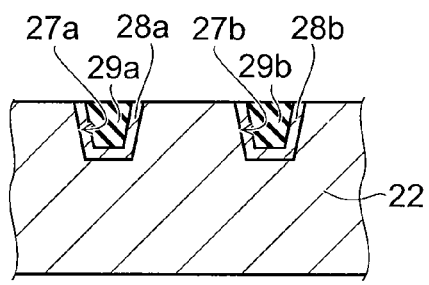

Subsequently, as illustrated in FIG. 6D, flattening is performed until the surface of the silicon substrate 22 is exposed. The flattening may be performed by using a CMP (Chemical Mechanical Polishing) method, for example.

By performing such flattening, the liner layers 28a and 28b are formed inside the trenches 27a and 27b, and the insulating material (the insulating regions 29a and 29b) are buried inside the trenches 27a and 27b.

Figure 6E:
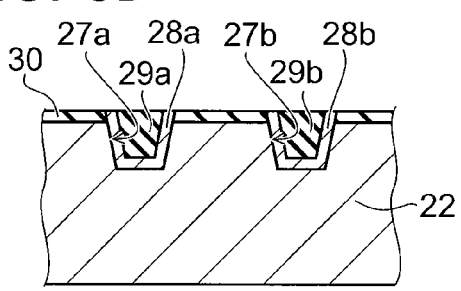

Subsequently, as illustrated in FIG. 6E, the gate insulating film 30 is formed on the surface of the silicon substrate 22. That is, the surface of the silicon substrate 22 is oxidized, and the gate insulating film 30 is formed. The formation of the gate insulating film 30 can be made by using a thermal oxidation method, for example.

Figure 6F:
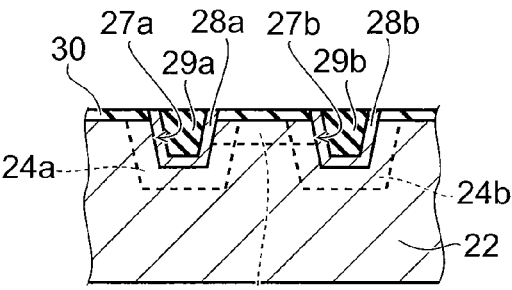

Subsequently, as illustrated in FIG. 6F, the channel formation region 23 and the offset regions 24a and 24b are formed.

That is, the n-type offset region 24b is formed inside the surface of the silicon substrate 22 which includes the region where the trench 27b has been formed, and the n-type offset region 24a is formed inside the surface of the silicon substrate 22 which includes the region where the trench 27a has been formed.

For example, the channel formation region 3 and the offset regions 24a and 24b can be formed by implanting a boron ion into the region where the channel formation region 23 is to be formed, by implanting a phosphorous ion into the regions where the offset regions 24a and 24b are to be formed, and by applying heat treatment.

Figure 6G:
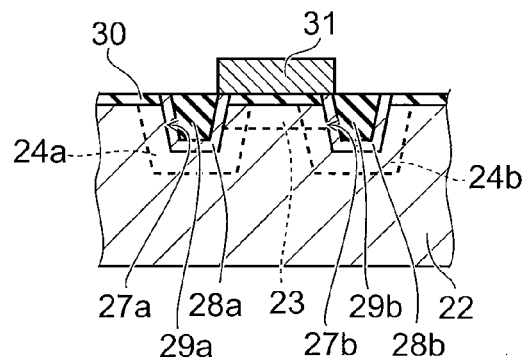

Subsequently, as illustrated in FIG. 6G, the gate electrode 31 is formed.

That is, the gate electrode 31 is formed through the gate insulating film 30 formed on the surface of the channel formation region 23 and the offset regions 24a and 24b.

The gate electrode 31 may be formed of polysilicon into which impurities are introduced, for example.

Figure 6H:
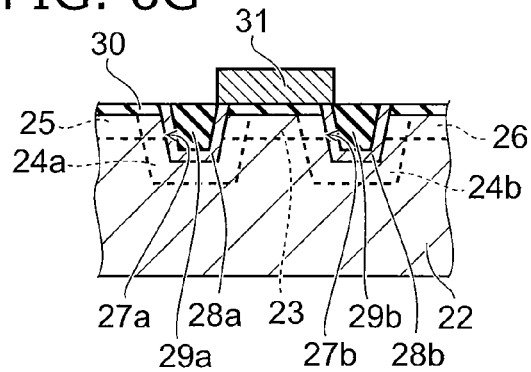

Subsequently, as illustrated in FIG. 6H, the source region 25 and the drain region 26 are formed.

That is, inside the surface of the silicon substrate 22 on the side opposite to the channel formation region 23 sandwiching the insulating region 29b between them, the n-type drain region 26 with impurity concentration higher than that of the offset region 24b is formed.

Also, the drain region 26 is formed, and inside the surface of the silicon substrate 22 on the side opposite to the drain region 26 sandwiching the channel formation region 23 and the insulating region 29a between them, the n-type source region 25 with impurity concentration higher than that of the offset region 24b is formed.

Figure 6I:
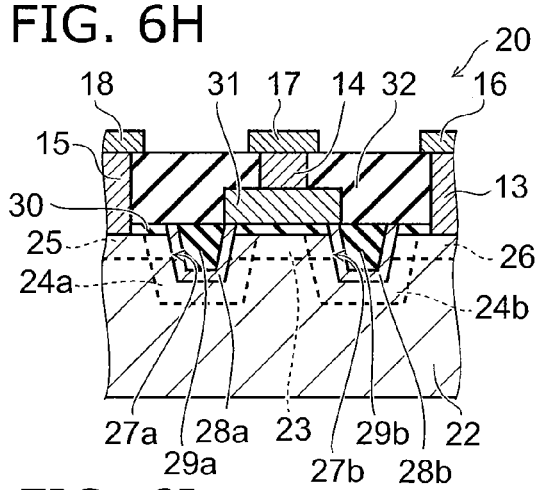

For example, the source region 25 and the drain region 26 can be formed by implanting an arsenic ion into the region where the source region 25 and the drain region 26 are to be formed and by applying heat treatment. Subsequently, as illustrated in FIG. 6I, the insulating film 32, the contacts 13 to 15, and the wires 16 to 18 are sequentially formed.

The semiconductor device 20 can be manufactured as above.

A known technology can be applied to formation of the element separation layer and the like, not shown, and the description will be omitted.

According to the embodiment, the liner layer can be formed along the moving path (current path) of the carrier. Thus, a semiconductor device that can reduce electric resistance and improve a breakdown voltage can be produced efficiently.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

For example, the shape, dimension, material, arrangement, quantity and the like of each element provided in the semiconductor devices 1, 1a, 20, 20a and the like are not limited to those exemplification but can be changed as appropriate. Also, the example using the n-type MOSFET is exemplified above, but the invention can be applied also to the p-type MOSFET.

What is claimed is:

1. A semiconductor device comprising:
   a channel formation region of first conductivity type;
   a first offset region of second conductivity type;
   a first insulating region buried in the surface of the first offset region;
   a first liner layer provided between the first offset region and the first insulating region, the first liner layer being formed of a conductive material and to be in contact with the first offset region;
   a first semiconductor region of second conductivity type provided on a side opposite to the channel formation region so as to sandwich the first insulating region therebetween and having impurity concentration higher than that of the first offset region;
   a second semiconductor region of second conductivity type provided on a side opposite to the first semiconductor region so as to sandwich the channel formation region therebetween and having impurity concentration higher than that of the first offset region;
   a gate insulating film provided on the channel formation region and the first offset region; and
   a gate electrode provided on the gate insulating film.

2. The device according to claim 1, further comprising:
   a second offset region provided between the channel formation region and the second semiconductor region and having impurity concentration lower than that of the second semiconductor region;
   a second insulating region buried in the surface of the second offset region; and
   a second liner layer provided between the second offset region and the second insulating region.

3. The device according to claim 2,
   at least either of the first liner layer and the second liner layer is provided along a moving path of a carrier.

4. The device according to claim 1, wherein
   the first liner layer is provided at least below the first insulating region.

5. The device according to claim 2, wherein
   the second liner layer is provided at least below the second insulating region.

6. The device according to claim 2,
   at least either of the first liner layer and the second liner layer is formed of a material having a lattice constant different from the lattice constant of silicon.

7. The device according to claim 2, at least either of the first liner layer and the second liner layer is formed of a material which generates tensile stress in silicon.

8. The device according to claim 1, wherein
   the conductive material is obtained by adjusting a lattice constant thereof using a solid solution of another semiconductor substance in silicon.

9. The device according to claim 1, wherein
   the thickness of the first liner layer is 10 nm or more and 20 nm or less.

10. The device according to claim 2, wherein
    the thickness of the second liner layer is 10 nm or more and 20 nm or less.

11. A method for manufacturing a semiconductor device comprising:

forming a first trench in the surface of a substrate;

forming a first liner layer inside the first trench, the first liner layer being formed of conductive material;

forming a first insulating region by burying an insulating material inside the first trench on which the first liner layer has been formed;

forming an insulating film on the surface of the substrate;

forming a channel formation region of first conductivity type inside the surface of the substrate which does not include a region where the first trench has been formed;

forming a first offset region of second conductivity type inside the surface of the substrate which includes a region where the first trench has been formed, the first offset region being in contact with the first liner layer;

forming a first semiconductor region of second conductivity type having impurity concentration higher than that of the first offset region inside the surface of the substrate on a side opposite to the channel formation region so as to sandwich the first insulating region therebetween;

forming a second semiconductor region of second conductivity type having impurity concentration higher than that of the first offset region inside the surface of the substrate on a side opposite to the first semiconductor region so as to sandwich the channel formation region therebetween; and forming a gate electrode through the insulating film formed on the surfaces of the channel formation region and the first offset region.

12. The method according to claim 11, further comprising:

forming a second trench in the surface of the substrate along with the forming the first trench;

forming a second liner layer inside the second trench along with the forming the first liner layer; and forming a second offset region of second conductivity type inside the surface of the substrate which includes a region where the second trench has been formed along with the forming the first offset region.

13. The method according to claim 11, in the forming the first liner layer inside the first trench, the first liner layer is provided at least on the lower face of the first trench.

14. The method according to claim 12, in the forming the second liner layer inside the second trench along with the forming the first liner layer, the second liner layer is provided at least on the lower face of the second trench.

15. The method according to claim 12, at least either of the first liner layer and the second liner layer is formed of a material having a lattice constant different from the lattice constant of silicon.

16. The method according to claim 12, at least either of the first liner layer and the second liner layer is formed of a material which generates tensile stress in silicon.

17. The semiconductor device according to claim 1, wherein the first liner layer includes silicon germanium.

18. The method for manufacturing a semiconductor device according to claim 11, wherein the first liner layer includes silicon germanium.

* * * * *